United States Patent [19]
Salzer et al.

[11] Patent Number: 4,718,119
[45] Date of Patent: Jan. 5, 1988

[54] AGC CIRCUIT INCLUDING A PRECISION VOLTAGE CLAMP AND METHOD

[75] Inventors: William E. Salzer, Gilbert; Jay W. Gustin, Scottsdale, both of Ariz.

[73] Assignee: Motorola Inc., Schaumburg, Ill.

[21] Appl. No.: 644,587

[22] Filed: Aug. 27, 1984

[51] Int. Cl.$^4$ ............................................. H04B 9/00
[52] U.S. Cl. ........................... 455/619; 330/278; 330/279; 358/178; 455/245
[58] Field of Search ............... 455/606, 607, 617, 619, 455/239, 240, 242, 244, 245, 246; 358/172, 173, 174, 176, 178, 179; 330/278, 279

[56] References Cited

U.S. PATENT DOCUMENTS 3,598,902  8/1971  Davis et al. .................... 358/178
3,740,471  6/1973  Wilcox ........................... 358/178

FOREIGN PATENT DOCUMENTS 52-50678  4/1977  Japan ............................ 330/278

OTHER PUBLICATIONS

Artel Comm Corp. Application Note CG-2—"Fiber Optics"—1983.
Artel Comm Corp. Tech. Bulletin T-2011/R-2011-/T-2012/R-2012/T2013/R2013.
Artel Comm Corp.—2016/2017—Fiber Optics Computer Graphics.
Artel Comm. Corp.—Application Note CG-1—Fiber Optics—1982.
Moustakas et al.—"Comparison of BJT and MESFET'"—1982, Chapman & Hull, pp. 57-60.
Williams—Optoelectronics CKTS—1982, IEEE Internat. Solid State CKTS Lont-pp. 160-101.
Lineback-"Master Slice Approach"—Electronics—May 1981-vol. 54 #10, pp. 39-40.
Eppes et al.—"A Two Kilometer Optical Fiber'"—Conf. Electromagnetic Wave Propagation Panel, May 16-20, 1977, pp. 14-1-14-9.
Hullett et al.—Optimum Transimpedance—1981, Chapman & Hull, pp. 65-69.

*Primary Examiner*—Joseph A. Orsino, Jr.
*Attorney, Agent, or Firm*—William J. Kubida; Dale E. Jepsen

[57] ABSTRACT

An AGC circuit including a precision voltage clamp and method by which a receiver output voltage may be referenced to virtualy any level desired. The circuit and method of the present invention provide an extremely precise AGC and fast clamp ideal for use in RGB data transmission in a fiber optic receiver.

11 Claims, 9 Drawing Figures

FIG. 1 — PRIOR ART —

— PRIOR ART —

COMPOSITE VIDEO SIGNAL

AGC CIRCUIT INCLUDING A PRECISION VOLTAGE CLAMP AND METHOD

BACKGROUND OF THE INVENTION

The present invention relates, in general, to the field of AGC circuits and methods. More particularly, the present invention relates to an AGC circuit including a precision voltage clamp and method of especial usefulness in a fiber optic receiver for receipt of red, green and blue (RGB) data transmission.

It has long been known that fiber optic links can provide significant advantages in signal transmission over conventional techniques using coaxial cable, twin lead or twisted conductor pairs. Such wires are inherently susceptible to the pick up of external interference thereby distorting signal transmission. Further, these wiring techniques require significantly increased driving currents in signal transmission as the length of the interconnecting wire and signal bandwidth requirements increase due to their inherent capacitance as well as other attenuating factors. Importantly, these conventional techniques themselves can never be made completely free of the spurious RF signal transmission, particularly as their length is increased or as relatively high frequency signals are applied. This drawback is especially serious when variable frequency signals are to be transmitted such that the potential RF emission is likewise variable and cannot be specifically suppressed at a given frequency.

Heretofore, fiber optic signal transmission has been known to alleviate the above shortcomings of conventional wiring techniques. However, such systems have not supplied sufficient system bandwidth for many high frequency applications (120 mHz or greater) while being capable of operation over fiber optic lengths on the order of one kilometer or more. Moreover, those systems which have existed have been unreasonably complex and cumbersome and, by their very nature, prohibitively expensive for most applications.

SUMMARY OF THE INVENTION

It is therefore an object of the present invention to provide an improved AGC circuit including a precision voltage clamp and method.

It is further an object of the present invention to provide an improved AGC circuit including a precision voltage clamp and method for a fiber optic receiver.

It is still further an object of the present invention to provide an improved AGC circuit including a precision voltage clamp and method which may be referenced to virtually any level desired allowing compatibility with various monitor designs.

It is still further an object of the present invention to provide an improved AGC circuit-including a precision voltage clamp and method which is extremely fast and precise providing excellent channel-to-channel accuracy in RGB data transmission.

The foregoing and other objects are achieved in the present invention wherein there is provided an AGC circuit for monitoring a receiver output signal and adjusting the gain of the receiver in response thereto, wherein the input signal includes a synchronization pulse. The AGC circuit includes means for clamping the synchronization pulse to a first reference voltage level $V_{REF1}$. Means also provide a fixed duration strobe pulse when the synchronization pulse reaches a second reference voltage level $V_{REF2}$. Additional means are strobed by the providing means strobe pulse for producing a first AGC voltage level while the synchronization pulse is below a third reference voltage level $V_{REF3}$ and a second AGC voltage level when the synchronization pulse reaches the third reference voltage level. Means are also provided for gain controlling the input signal in response to the first and second AGC voltage levels whereby the input signal level through the gain controlling means is greater in response to the first AGC voltage level and lesser in response to the second AGC voltage level.

A specific embodiment of an AGC circuit in accordance with the present invention for use with a receiver including a gain control element and an output amplifier for producing an output signal includes a first amplifier having as inputs a first reference voltage level and the output signal. The first amplifier produces a clamped signal level in response thereto. A first comparator has as inputs the output signal and a second reference voltage level. The first comparator produces an enable signal in response thereto. A fixed duration pulse producing circuit is operable in response to the enable signal for producing a strobe signal in response thereto. A second comparator has as inputs the output signal and a third reference voltage level for producing an intermediate signal in response thereto upon enablement by the strobe signal. A second amplifier has as an input the intermediate signal for producing an AGC signal to the gain control element in response thereto.

BRIEF DESCRIPTION OF THE DRAWINGS

The above-mentioned and other features and objects of the present invention and the manner of attaining them will become more apparent and invention itself will be best understood by reference to the following description of an embodiment of the invention taken in conjunction with the accompanying drawings, wherein.

DESCRIPTION OF A PREFERRED EMBODIMENT

Figure 1:
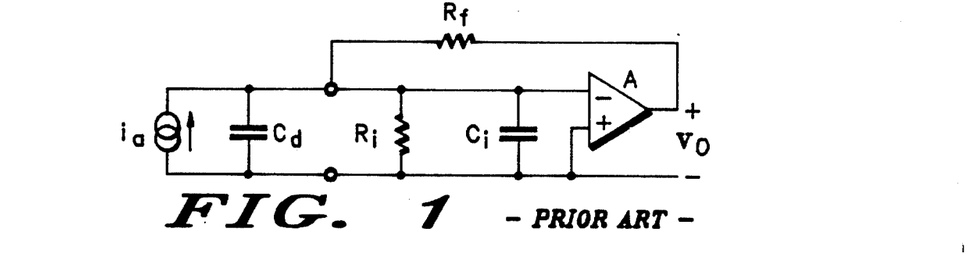
FIG. 1 is an electrical model for a prior art transimpedance preamplifier useful in understanding the principles of the present invention.

With reference to FIG. 1, a prior art optical transimpedance preamplifier model is shown. The circuit model for the prior art transimpedance preamplifier illustrated is described in: Hullett, J. L. and Moustakas, S., "Optimum Transimpedance Broadband Optical Preamplifier Design", *Optical and Quantum Electronics* 13 (1981) 65–69. See also: Moustakas, S., Hullett, J. L. and Stephens, T. D., "Comparison of BJT and MESFET Front Ends in Broadband Optical Transimpedance Preamplifiers", *Optical and Quantum Electronics* 14 (1982) 57–60.

The purpose of the circuit modeled in FIG. 1 is to produce an output voltage ($V_o$) from an input current, that is, the photo current ($i_d$) generated in a photodiode optical detector when struck by light conducted through an optical fiber. Therefore, $i_d$ is the current generated by the photodiode, $C_d$ is the capacitance of the photodiode, $R_i$ and $C_i$ are the input resistance and capacitance respectively of the open loop amplifier where A is the open-loop mid-frequency voltage gain and $R_f$ is the feedback resistance. For this amplifier, the current to voltage transfer function is given by the equation:

$$H(w) = \frac{R_f}{1 + iw(R_f C_t / A)} \quad (1)$$

with $$C_t = C_d + C_i. \quad (2)$$

The 3 dB bandwidth $w_h$ is then $$w_h = A/R_f C_t. \quad (3)$$

Figure 2:
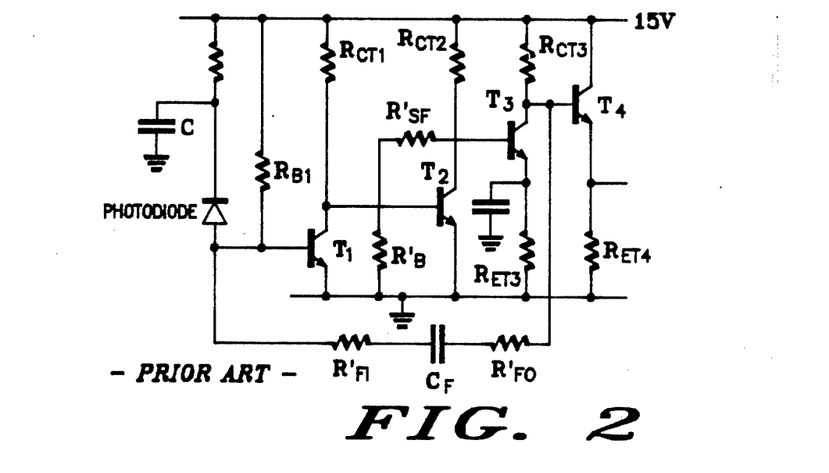
FIG. 2 is a schematic diagram of a prior art transimpedance preamplifier in accordance with the electrical model of FIG. 1.

With reference also to FIG. 2, in order to minimize amplifier noise, $R_f$ should be maximized and $C_t$ minimized. Maximization of $R_f$ while maintaining a given bandwidth implies maximization of A and minimization of $C_t$. Circuit design consideration and the stability of the closed loop determine the maximum achievable value of A whereas minimization of $C_t$ requires the following:

1. A low capacitance photodiode,
2. A low capacitance input transistor, T1, and
3. A second stage which has low input impedance to minimize the Miller capacitance of T1. A common base second stage is commonly used to achieve the third objective, however, shunt feedback via $R_{SF}$ gives the common-emitter stage of the prior art transimpedance amp of FIG. 2 as low an input impedance as a common base configuration, as well as a higher gain such that A is maximized.

In the prior art transimpedance preamplifier of FIG. 2, excess DC input current had no where to go but into the base of T1.

Figure 3:
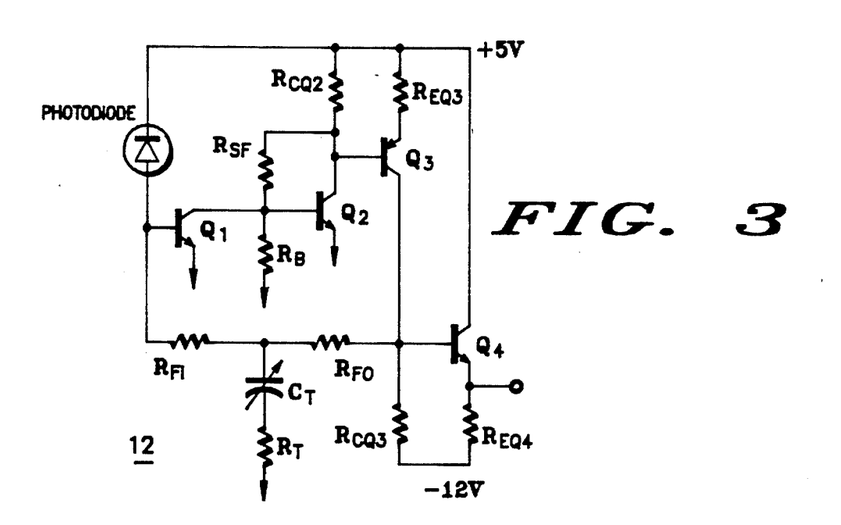
FIG. 3 is a schematic diagram of a transimpedance amplifier in accordance with the present invention illustrating the use of a non-capacitive resistive feedback network for use, for example, with an optical signal.

Referring additionally now to FIG. 3, a transimpedance (TZ) amp 12 in accordance with the present invention is shown in which DC feedback due to the absence of $C_F$ provides a path by which excess DC input current can be shunted away from Q1 allowing its base and collector currents to remain relatively constant. The large DC open loop transimpedance gain means that only a tiny increase in input current, appearing as Q1 base current, is needed to create a large negative increase in output voltage at the collector of Q3, which appears entirely across resistors $R_{FO}$ and $R_{FI}$ since the input voltage is virtually constant. The increase in base current at Q1 then is only just enough to cause the output voltage to be large enough to draw the remainder of the excess input current through feedback resistors $R_{FI}$ and $R_{FO}$. Stated a different way, the excess input current flowing though $R_{FI}$ and $R_{FO}$ reduces the voltage across $R_{CQ3}$ and therefore, the current $R_{EQ3}$ and the voltage drop across it.

Consequently, the collector voltage of Q2 rises increasing the current in $R_{SF}$ and decreasing the current in $R_{CQ2}$ and Q2. The corresponding reduction in base current at Q2 combines with the increase in current through $R_{SF}$ to ultimately increase the collector and base currents of Q1. The increase in base current in Q1 is only that part of the excess input current which does not flow through $R_{FI}$ and $R_{FO}$. As above described, the collector bias current at Q1 changes according to how much excess DC input current exists. The variation in the beta of Q1, Q2 and Q3 can also change Q1's collector bias current. However, the net variation in Q1's bias current due to these effects is as much as an order of magnitude less in transimpedance amp 12 than in the prior art transimpedance preamplifier of FIG. 2. Unlike the prior art transimpedance preamplifier, collector bias current of Q1 is not determined by the size of the DC input current and the beta of Q1. The collector voltage of Q2 determines the DC current in resistor $R_{SF}$ as well as the collector bias current of Q2 which, along with beta, sets Q2's base current. The collector bias current in Q1 then is the current in resistor $R_{SF}$ less the base current of Q2 and the current in resistor $R_B$ which is always constant. DC feedback is provided in transimpedance amp 12 from Q3 to Q1 by changing T3 in the prior art transimpedance preamplifier of FIG. 2 from an NPN to a PNP and eliminating capacitor $C_f$. $R_{BI}$ is therefore, unnecessary and may be eliminated.

Gain tolerances in optical emitters, detectors, and fibers cause variations in DC input current. Moreover, the range of fiber lengths over which a given system is required to operate can lead to large variations in fiber attenuation and therefore, DC input current from optical length to optical length. Without DC feedback from Q3 to Q1, transistor Q1 is affected as above described. In this regard, all of the aforementioned DC input current variation becomes variation in base bias current, and consequently in collector bias current. This collector bias current variation is compounded by beta variation, assuming Q1 is not selected to be within a very tight beta range, which option would prove to be very expensive. The very large variation in collector bias current which can result, causes four major problems.

The first of these problems is severe variation in bandwidth and peaking of the amplifier due to changes in Q1's fT and input capacitance, and therefore, $C_t$ as above described. The current and voltage bias conditions, and therefore, fT, for both Q2 and Q3 are also affected, contributing to the problem. Additionally, severe variation in amplifier noise performance may result since amplifier noise increases as the size of Q1's base bias current increases. Thirdly, poor input dynamic range can result. An order of magnitude increase in the collector current in Q1 could cause Q2 to cut off and/or Q3 to approach or enter saturation. In either case, distortion of the output signal will result. Finally, poor reliability would be encountered as Q1 is typically a small geometry, low current device in order to minimize its input capacitance. Consequently, an order of magnitude increase in collector bias current could easily exceed the maximum rating of Q1. In addition, the $V_{CE}$ breakdown of Q2 could be exceeded. In transimpedance amp 12, use of DC feedback from Q3 to Q1 maintains a relatively constant collector bias current in Q1 thereby greatly reducing the magnitude of the above described problems.

It should also be noted that amplifier bandwidth can be severely restricted by the parasitic capacitances associated with feedback resistors $R_{FI}$ and $R_{FO}$. The parasitics for each resistor can exist as both a capacitance between the resistor body and ground, and in end-to-end capacitance in parallel with the resistor. The bandwidth limiting effects of these parasitics can be reduced simply by reducing $R_{FO}$ and/or $R_{FI}$. However, this solution reduces amplifier gain and increases amplifier noise. Instead, resistor $R_T$ and $C_T$ can be used to compensate for these parasitic capacitances, such that the maximum possible gain and bandwidth may be realized.

In summary, transimpedance amp 12 uses D.C. feedback from Q3 to Q1 to maintain a relatively constant collector bias current in Q1, resulting in the following improvements to the prior art:

(1) a much more stable bandwidth and frequency response flatness, over a wide range of signal amplitudes and transistor betas;

(2) less amplifier noise;

(3) improved D.C. stability and therefore more input dynamic range;

(4) better reliability.

In addition, the compensation network comprising resistor $R_T$ and capacitor $C_T$ gives transimpedance amp 12 a much higher gain times bandwidth product than the prior art.

As above described, Q1 of transimpedance amp 12 may be either a FET or a bipolar junction transistor. Either must be employed in the common-source/emitter mode to minimize amplifier noise. Should Q1 be a device which requires a negative gate voltage, Q2 may then be changed to a PNP device in order to reduce the voltage appearing across Q3. The third stage of transimpedance amp 12 increases the magnitude of A and inverts its phase for feedback purposes. The emitter follower buffer of Q4 provides a low output impedance to subsequent circuitry. In the embodiment of transimpedance amp 12 above described, the photodiode may be an MFOD1100 device available from Motorola, Inc., assignee of the present invention. Transistors Q1 and Q2 may be furnished as MRF931 devices while Q3 and Q4 are MRF536 and MRF901 devices respectively. Resistors $R_{SF}$ and resistor $R_B$ have values of two 2 K and 840 ohms respectively. Resistor $R_{CQ2}$ has a value of 250 ohms while resistor $R_{EQ3}$ has a value of zero ohms. Resistor $R_{CQ3}$ has a value of 500 ohms while resistor $R_{EQ4}$ has a value of 680 ohms. Resistor, $R_{FI}$ has a value of 120 K ohms while resistor $R_{FO}$ has a value of 5K ohms. Capacitor $C_T$ may have a variable rating of L between 1 and 3 pf while resistor $R_T$ has a value of 700 ohms.

Transimpedance amp 12 comprises a photodiode having its anode connected to the base of transistor Q1 and its cathode connected to a source of positive five volts. Alternatively, the photodiode's cathode could be connected to the base of the base of transistor Q, and its anode connected to the negative voltage source. Transistor Q1 has its emitter connected to circuit ground and its collector connected to the base terminal of transistor Q2 which also has its emitter terminal connected to circuit ground. The collector terminal of transistor Q2 is coupled to the positive five volt source through resistor $R_{CQ2}$. The base terminal of transistor Q2 is coupled to circuit ground through resistor $R_B$. Feedback from the collector of transistor Q2 to its base terminal is supplied through resistor $R_{SF}$. The collector terminal of transistor Q2 is likewise connected to the base of transistor Q3 having its emitter coupled to the source of positive five volts through resistor $R_{EQ3}$. The collector terminal of transistor Q3 is connected to the base terminal of transistor Q4 having its collector terminal connected to the positive five volt source. Output of transimpedance amp 12 is taken at the emitter of transistor Q4 which is coupled to a source of negative 12 volts through resistor $R_{EQ4}$. A source of negative 12 volts is likewise applied to the collector of transistor Q3 and the base of transistor Q4 through resistor $R_{CQ3}$. Resistive feedback from the collector of transistor Q3 to the base of transistor Q1 is supplied through the series connection of resistors $R_{FI}$ and $R_{FO}$. The series connection of capacitor $C_T$ and resistor $R_T$ connects the feedback path to circuit ground as shown.

It should be noted that the parallel combination of a diode and capacitor may be placed between the emitter of transistor Q2 and circuit ground, the diode having its cathode to ground. Additionally, a diode string may be placed in the collector of Q3 to allow for a higher positive supply voltage.

Figure 4:
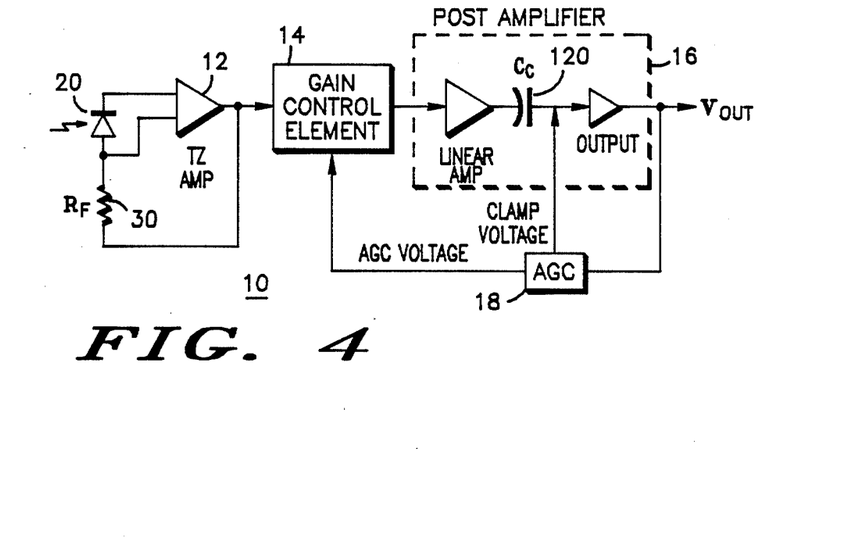
FIG. 4 is a simplified block diagram of a receiver in accordance with the present invention which may utilize the transimpedance amplifier of FIG. 3 for use, for example, with an optical fiber.

With reference now to FIG. 4, a receiver 10 in accordance with the present invention is shown. Receiver 10 comprises in major part, transimpedance amp 12 having as input a current generated by an optical signal striking detector 20 such as a photodiode. A feedback path from the output of transimpedance amp 12 is supplied as above described through resistor $R_F$. The output of transimpedance amp 12 is applied to gain control element 14 having its output connected to an input of post amp 16. Post amp 16 comprises a linear amplifier having its output coupled through capacitor 120 ($C_C$) for input to an output stage to drive a $V_{OUT}$ line. $V_{OUT}$ line is fed back through AGC circuit 18 to provide an AGC voltage to gain control element 14. In addition, a clamp voltage is generated by AGC circuit 18 for adjustment of post amp 16 as shown. The circuit configuration and operation of receiver 10 will be more fully described hereinafter.

Figure 5:
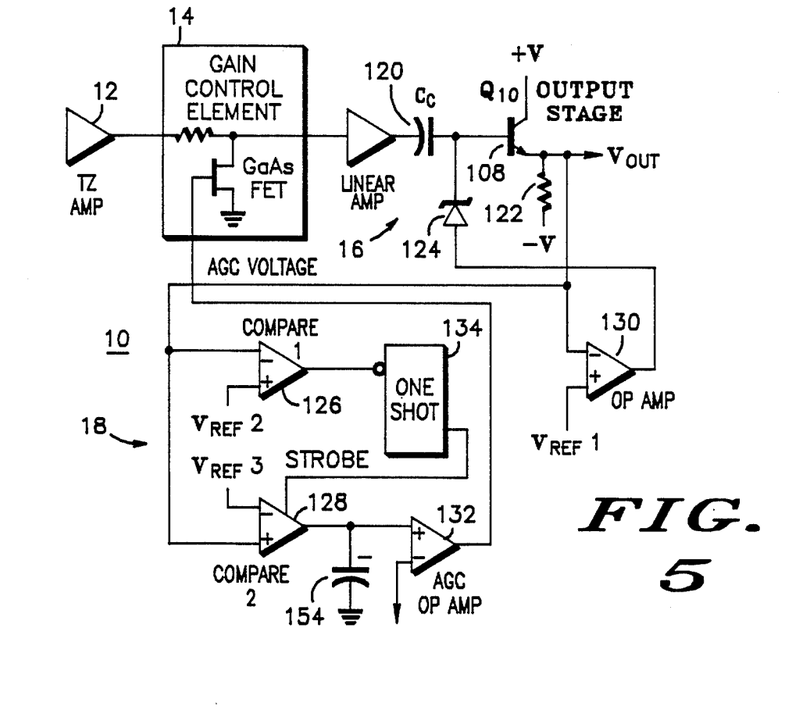
FIG. 5 is an expanded block diagram of the receiver of FIG. 4 showing a more detailed representation of the AGC circuit thereof in accordance with the present invention.

Referring additionally now to FIG. 5, a further representation of receiver 10 in accordance with the present invention is shown useful in describing the operation of AGC circuit 18. Circuit elements shown but not described with respect to the operation of AGC circuit 18 will be more fully described hereinafter. In this simplified representation of AGC circuit 18, an output voltage appearing on line $V_{OUT}$ is supplied to the negative input of op amp 130 having its positive input connected to a source of $V_{REF1}$. The voltage appearing on line $V_{OUT}$ also is supplied as input to the inverting input of comparator 126 (compare 1) and the noninverting input of comparator 128 (compare 2). The noninverting input of comparator 126 is connected to a source of $V_{REF2}$ while the inverting input of comparator 128 is connected to a source of $V_{REF3}$. Output from comparator 126 is supplied to an active low input of one shot 134 for supplying a strobe input to comparator 128. The output of comparator 128 is connected to the positive input of AGC op amp 132 as well as coupled to circuit ground by means of capacitor 154. The negative input of AGC op amp 132 is connected to circuit ground. Output from AGC op amp 132 is then applied as gate drive to gain control element 14 as will be more fully described hereinafter.

Figures 6A, 6B, 7:
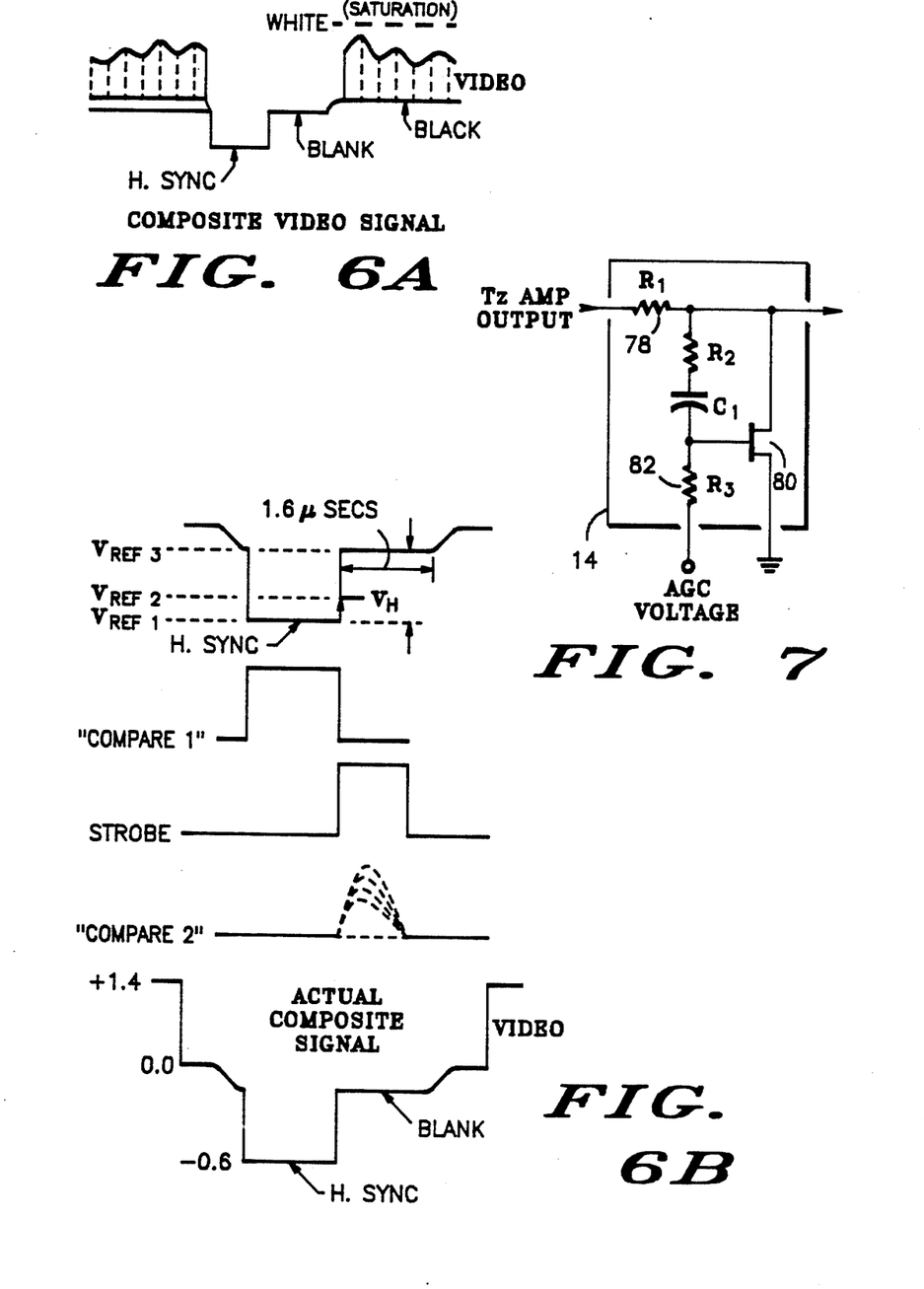
FIGS. 6A and 6B illustrate simplified waveforms of a composite video signal and circuit responses useful in understanding the operation of the AGC circuit shown in FIG. 5.
FIG. 7 is a schematic diagram of a gain control element for use, in the receiver of FIGS. 4 and 5.

With reference additionally to FIGS. 6A and 6B, a composite video signal is shown useful in describing the operation of AGC circuit 18 of receiver 10 as shown in FIG. 5. AGC circuit 18 is configured for red, green, and blue (RGB) composite video signal processing, that is, three channel analog information in which each channel contains synchronization information. A separate receiver 10 is used for each of the red, green and blue video signals. Since the video signal is a variable, the horizontal sync pulse is measured to determine AGC voltage as this sync pulse is always the same amplitude, independent of video. The operation of AGC circuit 18 must be very precise because any amplitude differences between the three (RGB) color signals will result in impure color mix and incorrect gray levels.

The output voltage, $V_{OUT}$, appearing at the emitter of NPN transistor 108 may be considered a "standardized" output. With no signal into the output stage, $V_{OUT}$ will move towards the voltage $-V$ applied to resistor 122 until $V_{OUT}$ equals $V_{REF1}$. Op amp 130 will then provide base current to NPN transistor 108 through schottky diode 124 causing $V_{OUT}$ to remain at $V_{REF1}$ in a quiescent state. Accuracy of $V_{OUT}$ attaining $V_{REF1}$ is determined by the input offset voltage (in microvolts) of op amp 130. Thus, it can be seen that by changing the level of $V_{REF1}$, $V_{OUT}$ can be adjusted to any desired value within the range of the output stage comprising NPN transistor 108. By adjusting the values of $+V$ and $-V$ the available range of $V_{OUT}$ is virtually limitless. This adjustability is of special importance when used in conjunction with high resolution monitors, such as are used in video graphics displays, since input levels are not standardized. When a composite video signal is presented to receiver 10 as shown in FIG. 6B, the horizontal sync pulse, being most negative, will be clamped to the level of $V_{REF1}$ as shown. The composite video signal at the output stage ($V_{OUT}$) will vary from $V_{REF1}$ to $V_{REF1} + \Delta V$ output signal.

As above described, by means of AGC circuit 18, the output voltage, $V_{OUT}$ is clamped to $V_{REF1}$. The output signal starts positive as the rising edge of H sync as shown in FIG. 6B. When the level of $V_{REF2}$ is reached, the output of comparator 126 will switch low, triggering one-shot, 134. The output width of one-shot 134 is adjusted to provide a one microsecond strobe pulse to comparator 128. The strobe pulse enables comparator 128 to measure the amplitude of the rising edge of the horizontal synch pulse, $V_H$. With no signal in, that is $\Delta V_{OUT}=0$, $V_{OUT}$ will remain at the level of $V_{REF1}$ as explained above. Therefore, the output of comparator 128 is slightly negative. AGC op amp 132 will amplify the slightly negative output of comparator 128 providing an AGC voltage of several volts negative. This forces the GaAs FET of gain control element 14 to a high channel resistance resulting in maximum receiver gain.

When the input signal becomes large enough that $V_{OUT}$ reaches the level of $V_{REF3}$, comparator 128 will begin to pulse positive during a strobe from one shot 134, causing AGC op amp 132 to provide a less negative voltage to the GaAs FET gate of gain control element 14. This forces the GaAs FET to a lower channel resistance, which begins to attenuate the output of transimpedance amp 12. As the input signal becomes larger, comparator 128 pulses more positive, driving the AGC voltage at the output of AGC op amp 132 more positive until equalibrium is obtained. Thus, AGC circuit 18 adjusts the gain of receiver 10 so that the amplitude of the horizontal sync pulse ($V_{OUT}$) remains constant, independent of input level. In the above described embodiment, $V_{REF1}$ equals $-0.6$ volts; $V_{REF2}$ equals $-0.5$ volts; and $V_{REF3}$ equals 0.0 volts or circuit ground.

By means of AGC circuit 18, the output of receiver 10 can be referenced to virtually any level desired. This allows compatibility with all known monitor input designs whether utilizing dc or ac coupling. The AGC action of AGC circuit 18 is very precise providing excellent accuracy in RGB data transmission. Moreover, the AGC clamp action is extremely fast allowing much higher horizontal scan rates which in turn, allows much higher resolution displays.

With reference to FIG. 7 gain control element 14 of receiver 10 is shown. Gain control element 14 has as an input the output of transimpedance amp 12 as shown in FIG. 4. Input to gain control of element 14 is through resistor 78 ($R_1$) which has its other terminal connected to the drain of FET 80 ($Q_5$). The series connection of resistor R2 and C1 may couple the drain of FET 80 to its gate depending upon the type of FET 80 utilized. Resistor 82 ($R_3$) receives as input an AGC voltage from the output of AGC circuit 18 as shown in FIG. 4. Also as shown in FIG. 7, the source terminal of FET 80 is coupled to circuit ground. Output from gain control element 14 is supplied to the input of post amp 16.

With reference additionally now to FIG. 4, the output of transimpedance amp 12 of receiver 10 must be gain controlled so that the output of receiver 10 remains constant independent of the length of the optical fiber providing input to detector 20 as well as overall receiver 10 gain variations. A GaAs FET may be utilized due to its very wide linear range which allows it to accept a large peak to peak voltage as well as providing an excellent range of channel resistance variation. In addition, the device capacitance of a GaAs FET is much lower than other devices, allowing operation over a very wide bandwidth. As shown in FIG. 7, resistor 78 and FET 80 form a voltage divider. AGC voltage causes the channel resistance of FET 80 to vary. By proper choice of the value of resistor 78, as well as the input impedance of post amp 16, a gain control of 20 dB is readily achievable. Capacitor $C_1$ with resistor $R_2$ and resistor 82 form a compensation network that extends the linear operating range of FET 80. In certain other applications, FET 80 may be a junction FET and resistor R2 and capacitor C1 may be unnecessary.

Figure 8:
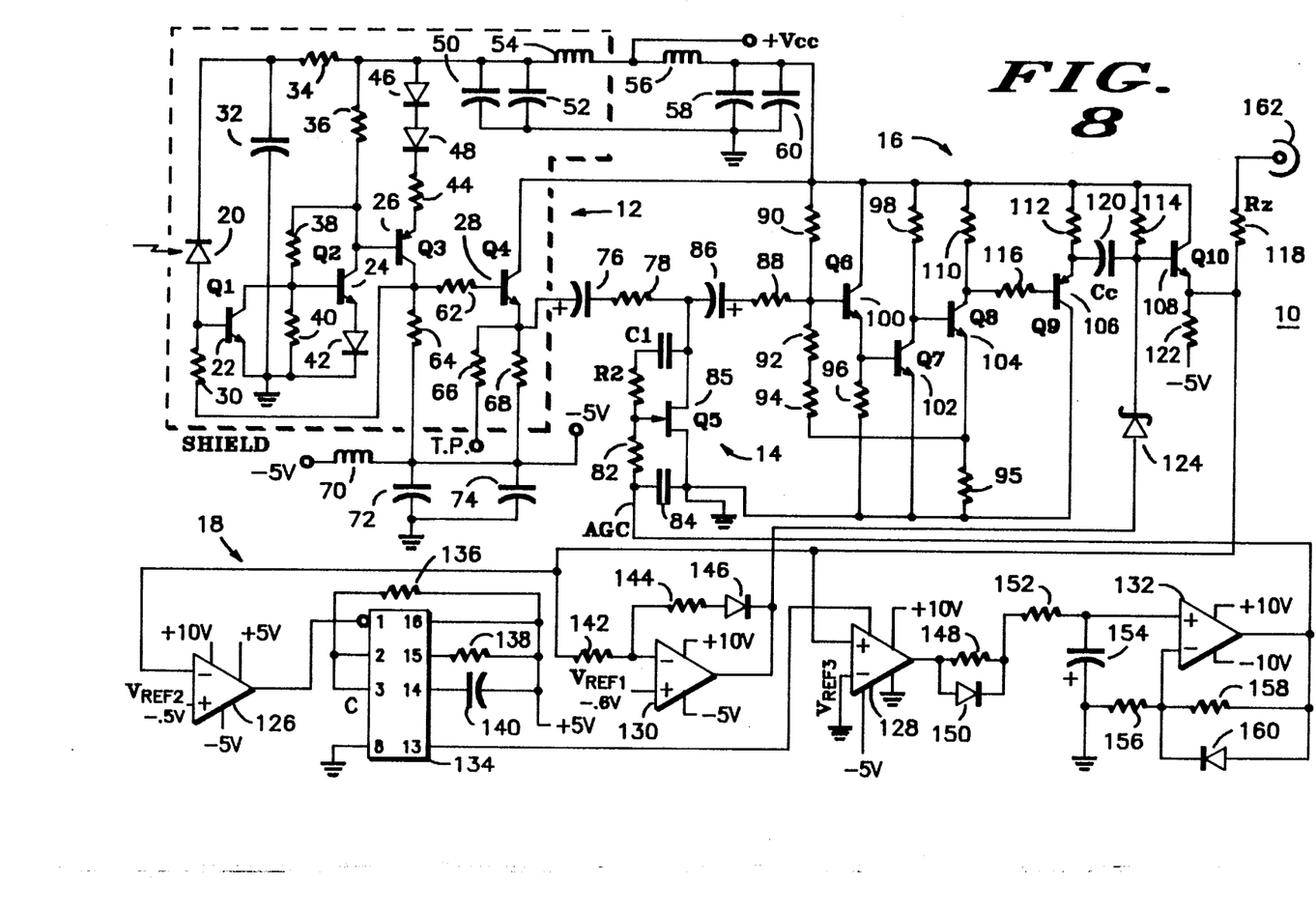
FIG. 8 is a schematic diagram of the receiver of FIGS. 4 and 5 illustrating the detailed circuit innerconnections thereof.

With specific reference to FIGS. 4 and 8, a receiver 10 is shown which may be used, for example, as an analog fiber optic receiver for very high resolution video graphics. Receiver 10 will provide an overall bandwidth of approximately 200 MHz ($-3$ dB) and can easily handle 1,024×1,280 high resolution video monitors. By use of a very precise AGC circuit 18, receiver 10 may be utilized in precise RGB monitor applications.

Power received in a fiber optic version of receiver 10 is similar to an AM modulated RF carrier. The receiver must amplify the received signal, in this case optical power, and must adjust receiver gain automatically by means of an AGC as well as setting the output of receiver 10 to a desired reference.

Detector 20 may be any suitable optical device such as a photo transistor, avalanche photodiode, PIN diode etc. Transimpedance amp 12 may be any circuit that transforms optical power into electrical power. Gain control element 14 may be any suitable device having a linear operating range such as a transistor, PIN diode, variable resistor or FET. Post amp 16 may be any circuit that can linearly amplify its input voltage to a desired level with a desired bandwidth. The output of post amp 16 must be set to a desired output voltage, compatible with the monitor that the receiver drives. AGC circuit 18 may be any combination of devices or circuitry that drives gain control element 14 such that the output of receiver 10, $V_{OUT}$, is precisely controlled to a known value. In operation, optical power is received by the optical detector 20, in this case a PIN diode. A resulting current representative of the optical power is presented to transimpedance amp 12. Transimpedance amp 12 develops a voltage across its feedback resistor (RF) that is essentially the product of detector 20 current and the value of $R_F$. Since the voltage input to transimpedance amp 12 is virtually constant, this voltage across $R_F$ is essentially the output voltage of transimpedance amp 12.

Post amp 16 comprises, in pertinant part, NPN transistors 100 (Q6), 102 (Q7) and 104 (Q8). NPN transistor 100 is added in an emitter follower configuration between feedresistors comprising resistor 88 ($R_{F1}$) and resistors 92 and 94 ($R_{F2}$) and the base terminal of NPN transistor 102. NPN transistor 100 eliminates the Miller effect normally associated with the amplifier. As shown, the collector terminal of NPN transistor 100 is connected directly to a source of $V_{CC}$. This allows a very significant extension of the gain bandwidth product achievable with a feedback pair. PNP transistor 106 (Q9) is an emitter follower that quickly charges capacitor 120 ($C_C$) from the precision clamp during horizontal synchronization time. NPN transistor 108 (Q10) is the output stage emitter follower. Resistor 118 ($R_Z$) matches the receiver output to the load impedance of the monitor.

With reference to FIG. 8, a schematic representation of a receiver 10 in accordance with the present invention is shown. Receiver 10 comprises, in major part, transimpedance amp 12 having as an input an optical signal with an output to gain control element 14 connected to the input of post amp 16 comprising a linear amplifier and output stage. An AGC circuit 18 couples the output of post amp 16 to gain control element 14.

Transimpedance amp 12, which may be enclosed within and RF shield as shown, includes detector 20 for receiving an optical signal, for example, from an optical fiver link. Detector 20, which may comprise a conventional photodiode, has its anode connected to the base terminal of NPN transistor 22 (Q1) having its emitter connected to circuit ground. Capacitor 32 couples the cathode of detector 20 to the grounded emitter of NPN transistor 22. Resistor 40 ($R_B$) couples the common connected collector of NPN transistor 22 and base of NPN transistor 24 to circuit ground. Resistor 38 ($R_{SF}$) provides a feedback path between the collector of NPN transistor 24 and its base. Diode 42, having its anode connected to the emitter of NPN transistor 24 has its cathode connected to circuit ground also. Resistor 34 couples one terminal of capacitor 32 to resistor 36 ($R_{CQ2}$) which is in turn connected to the collector of NPN transistor 24. Resistor 34 is also connected to the series connected diodes 46 and 48 which are in turn, in series with resistor 44 ($R_{EQ3}$) connected to the emitter of PNP transistor 26 (Q3). The common connection of resistor 34, diode 46 and resistor 36 connects to the decoupled source of supply voltage $V_{CC}$. The base of PNP transistor 26 is connected to the collector of NPN transistor 24 and the collector of PNP transistor 26 is coupled to the base of NPN transistor 22 through resistor 30 ($R_{FI}$). The collector of PNP transistor 26 is resistively coupled to the base of NPN transistor 28 (Q4) through resistor 62 and the collector of NPN transistor 28 is connected to a source of supply voltage ($V_{CC}$). Resistor 64 couples the collector of PNP transistor 26 to circuit ground through the parallel connection of capacitors 72 and 74. A source of negative five volts is applied to one terminal of capacitor 72 through coil 70 and is applied directly to one terminal of capacitor 74 as shown. This latter terminal of capacitor 74 is resistively coupled to the emitter of NPN transistor 28 through resistor 68. Resistor 66 is likewise connected to the emitter of NPN transistor 28 and provides a test point for the output of transimpedance amp 12, which output appears at the emitter of NPN transistor 28. $V_{CC}$ is likewise applied to transimpedance amp 12 through a filter network comprising the parallel combination of capacitors 50 and 52, and series connected coil 54. $V_{CC}$ is applied to post amp 16 through a filter network comprising series connected coil 56 and parallel connected capacitors 58 and 60. Capacitors 50 and 52 and coil 54 are within the RF shield surrounding transimpedance amp 12 while coil 56 and capacitors 58 and 60 are without this shield.

Output from transimpedance amp 12, as above described, appears at the emitter of NPN transistor 28. This output is applied to the positive electrode of capacitor 76 for resistive coupling through series connected resistor 78 ($R_1$) to the drain terminal of FET 80 (Q5) comprising gain control element 14. Gain control element 14 will be more fully described hereafter. Capacitor 86 having its negative electrode likewise connected to the drain of FET 80 has its positive electrode resistively coupled to the base of NPN transistor 100 (Q6) through resistor 88 ($R_{F1}$). The base terminal of NPN transistor 100 is likewise coupled to filtered $V_{CC}$ through resistor 90. The collector of NPN transistor 100 is connected to filtered $V_{CC}$ while its emitter is resistively coupled to circuit ground through resistor 96. The base terminal of NPN transistor 100 is likewise resistively coupled to circuit ground through the series connection of resistors 92, 94 ($R_{F2}$) and resistor 95. The emitter terminal of NPN transistor 100 is connected to the base of NPN transistor 102 (Q7) having its emitter connected to circuit ground and its collector resistively coupled to $V_{CC}$ through resistor 98. Similarly, the collector terminal of NPN transistor 102 is connected to the base of NPN transistor 104 (Q8) having its emitter resistively coupled to circuit ground through resistor 95 and its collector coupled to $V_{CC}$ through resistor 110. The collector of NPN transistor 104 is resistively coupled to the base terminal of PNP transistor 106 (Q9) having its collector connected to circuit ground and its emitter resistively coupled to filtered $V_{CC}$ through resistor 112. The emitter of PNP transistor 106 is capacitively coupled to the base of NPN transistor 108 through capacitor 120 ($C_C$). Resistor 114 couples the base of NPN transistor 108 to $V_{CC}$ as well as its collector terminal. The emitter terminal of NPN transistor 108 is resistively coupled to a source of minus 5 volts through resistor 122 as well as to output lead 162 ($V_{OUT}$) through resistor 118 ($R_Z$).

The output of post amp 16 is taken at the emitter of NPN transistor 108 for application to the inverting and non-inverting inputs of comparator 126 (compare 1) and comparator 128 (compare 2) respectively. The non-inverting input of comparator 126 is connected to a source of −0.5 volts ($V_{REF2}$). The inverting input of comparator 128 is connected to circuit ground ($V_{REF3}$). Output from comparator 126 is applied to an inverting input at pin 1 of one-shot 134. One-shot 134 has its number 2 and number 3 input pins coupled to a source of +5.0 volts through resistor 136. Similarly, a source of +5.0 volts is applied directly to pin 16 as well as resistively to pin 15 through resistor 138 and capacitively to pin 14 through capacitor 140. Pin eight of one-shot 134 is connected to circuit ground while a strobe output appears at pin 13 for input to comparator 128. Output of comparator 128 is applied to the positive input of AGC op amp 132 through resistor 152 in series with the parallel combination of resistor 148 and diode 150. Capacitor 154 couples the positive input of AGC op amp 132 to circuit ground as well as to the negative input thereof through resistor 156. A feedback path from the output of AGC op amp 132 is established to the negative input thereof through the parallel combination of resistor 158 and diode 160. The output of AGC op amp 132 is applied to the gate terminal of FET 80 through resistor 82 ($R_3$). The source terminal of FET 80 is connected to circuit ground as well as capacitively to the output of AGC op amp 132 by means of capacitor 84.

Op amp 130 has its positive input connected to a source of −0.6 volts ($V_{REF1}$) and its negative input coupled to the emitter of NPN transistor 108 through resistor 142. The output of op amp 130 is coupled to the base of NPN transistor 108 through schottky diode 124 ($CR_1$) for establishing a clamp voltage. The output of op amp 130 is likewise feedback to its negative input through the series combination of resistor 144 and diode 146.

Typical values, only as an example, for the components utilized in the embodiment of receiver 10 above described are:

| | |
|---|---|
| Q1 | MRF 931 |
| Q2 | MRF 931 |
| Q3 | MRF 536 |
| Q4 | MRF 901 |
| Q5 | MRF 966 |
| Q6 | MRF 901 |
| Q7 | MRF 901 |
| Q8 | MRF 901 |
| Q9 | MRF 536 |
| Q10 | MRF 901 |
| $R_{FI}$ | 36K ohms |
| $R_{CQ2}$ | 270 ohms |
| $R_{SF}$ | 1.5K ohms |
| $R_B$ | 620 ohms |
| $R_{EQ3}$ | 62 ohms |
| $R_{FO}$ | 100 ohms |
| R1 | 510 ohms |
| R3 | 1K ohms |
| $R_{F1}$ | 2.7K ohms |
| $R_{F2}$ | 10.2K ohms |
| $R_Z$ | 75 ohms |
| $C_c$ | 1 Microfarad |
| Compare 1 | MC1514 |
| Compare 2 | MC1514 |
| One Shot 134 | SN74LS123 |
| OP Amp 130 | OP37 |
| AGC Op Amp 132 | MC1741 |

What has been provided, therefore, is an improved AGC circuit including a precision voltage clamp and method which may be utilized in conjunction with a fiber optic receiver. The AGC circuit and method of the present invention may be referenced to virtually any level desired allowing compatibility with various monitor designs. The circuit and method above described is extremely fast and precise providing excellent channel-to-channel accuracy in RGB data tranamission.

It should be noted that in the application of the present invention above-described, the absolute value of the first reference voltage level is greater than the absolute value of the second reference voltage level which, in turn, is greater than the absolute value of the third reference voltage level. In applications of the present invention wherein the sync pulse remains negative going but is clamped to a more positive value such as 0.0 volts, the value of $V_{REF3}$ is then greater than the value of $V_{REF2}$ which is greater than the value of $V_{REF1}$.

While there have been described above the principles of the present invention in conjunction with specific apparatus, it is to be clearly understood that this description is made only by way of example and not as a limitation to the scope of the invention.

we claim:

1. An AGC circuit for a receiver including a gain control element and an output amplifier for producing an output signal comprising:
   a first amplifier having as inputs a first reference voltage level and said output signal, said first amplifier producing a clamping signal in response thereto;
   clamping means coupled to said first amplifier and to said output amplifier for clamping said output signal in response to said clamping signal;
   a first comparator having as inputs said output signal and a second reference voltage level, said first comparator for producing an enable signal in response thereto;
   a fixed duration pulse producing circuit operable in response to said enable signal for producing a strobe signal in response thereto;
   a second comparator having as inputs said output signal and a third reference voltage level for producing an intermediate signal in response thereto upon enablement by said strobe signal; and
   a second amplifier having as an input said intermediate signal for producing an AGC signal to said gain control element in response thereto.

2. The AGC circuit of claim 1 wherein said receiver is a fiber optic receiver.

3. The AGC circuit of claim 1 wherein said gain control element comprises an FET.

4. The AGC of claim 3 wherein said FET is a GaAs device.

5. The AGC circuit of claim 1 wherein said first and second amplifiers are operational amplifiers.

6. The AGC circuit of claim 1 wherein the absolute value of said first reference voltage level is greater than the absolute value of said second reference voltage level which is greater than the absolute value of said third reference voltage level.

7. The AGC circuit of claim 6 wherein said first, second and third reference voltage levels are substantially −0.6, −0.5 and −0.0 volts respectively.

8. The AGC circuit of claim 1 wherein the value of said third reference voltage level is greater than the value of said second reference voltage level which is greater than the value of said first reference voltage level.

9. An AGC circuit for monitoring a receiver output signal and adjusting the gain level of an input signal in response thereto, wherein said input signal includes a synchronization pulse, said circuit comprising:

- means for clamping said synchronization pulse to a first reference voltage level $V_{REF1}$;
- a comparator having as inputs an output of said clamping means and a second reference voltage level, $V_{REF2}$;
- a one-shot circuit coupled to an output of said comparator, for providing a fixed duration strobe pulse when said synchronization pulse reaches said second reference voltage level;
- means strobed by said one-shot circuit for producing a first AGC voltage level while said synchronization pulse is below a third reference voltage level $V_{REF3}$ and a second AGC voltage level when said synchronization pulse reaches said third reference voltage level; and
- means for gain controlling said input signal in response to said first and second AGC voltage levels whereby said input signal level through said gain controlling means is greater in response to said first AGC voltage level and lesser in response to said second AGC voltage level.

10. An AGC circuit for monitoring a receiver output signal and adjusting the gain level of an input signal in response thereto, wherein said input signal includes a synchronization pulse, said circuit comprising:

- means for clamping said sychronization pulse to a first reference voltage level $V_{REF1}$, thereby producing a damped synchronization pulse;
- means for providing a fixed duration strobe pulse when said clamped synchronization pulse reaches a second reference voltage level $V_{REF2}$;
- a comparator having as inputs an output of said clamping means and a third reference voltage level $V_{REF3}$, strobed by said means for providing said fixed duration strobe pulse, for producing a first AGC voltage level while said clamped synchronization pulse is below said third reference voltage level and a second AGC voltage level when said clamped synchronization pulse reaches said third reference voltage level; and
- means for gain controlling said input signal in response to said first and second AGC voltage levels whereby said input signal level through said gain controlling means is greater in response to said first AGC voltage level and lesser in response to said second AGC voltage level.

11. The AGC circuit of claim 10 further comprising:
- an amplifier coupling an output of said comparator to said gain controlling means.

* * * * *